(12) United States Patent
Cha et al.

(10) Patent No.: US 8,853,787 B2
(45) Date of Patent: Oct. 7, 2014

(54) HIGH VOLTAGE SEMICONDUCTOR DEVICE

(71) Applicant: Magnachip Semiconductor, Ltd., Cheongju-si (KR)

(72) Inventors: Jae-Han Cha, Cheongju-si (KR); Kyung-Ho Lee, Cheongju-si (KR); Sun-Goo Kim, Cheongju-si (KR); Hyung-Suk Choi, Cheongju-si (KR); Ju-Ho Kim, Cheongju-si (KR); Jin-Young Chae, Cheongwon-gun (KR); In-Taek Oh, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 13/690,973

(22) Filed: Nov. 30, 2012

(65) Prior Publication Data

US 2014/0151793 A1 Jun. 5, 2014

Related U.S. Application Data

(62) Division of application No. 12/835,514, filed on Jul. 13, 2010, now Pat. No. 8,362,556.

(30) Foreign Application Priority Data

Nov. 17, 2009 (KR) .................... 10-2009-0110927

(51) Int. Cl.
| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 29/78 | (2006.01) | |
| H01L 27/088 | (2006.01) | |

(52) U.S. Cl.
CPC .............. *H01L 27/088* (2013.01); *H01L 29/78* (2013.01); *H01L 29/7816* (2013.01)
USPC 257/369; 257/371; 257/E27.06; 257/E27.062

(58) Field of Classification Search
CPC ................... H01L 21/8238; H01L 21/823814; H01L 29/49; H01L 29/4933; H01L 29/94
USPC .................. 257/368, 369, 371, 374, E27.062, 257/E27.06
See application file for complete search history.

(56) References Cited

U.S. PATENT DOCUMENTS

| | | | | |
|---|---|---|---|---|
| 7,378,312 B2* | 5/2008 | Kim | ............................ | 438/243 |
| 8,362,556 B2* | 1/2013 | Cha et al. | ..................... | 257/337 |
| 8,546,890 B2* | 10/2013 | Kuo et al. | .................... | 257/393 |

FOREIGN PATENT DOCUMENTS

| | | |
|---|---|---|
| CN | 1685442 A | 10/2005 |
| KR | 10-2006-0093180 A | 8/2006 |
| KR | 10-2004-002017 A | 1/2007 |

OTHER PUBLICATIONS

Korean Office Action, issued in Korean Patent Application No. 10-2009-0110927, dated Feb. 17, 2011 (5 pages).
Chinese Office Action issued Apr. 23, 2014 in counterpart Chinese Application No. CN 201010541059.3 (6 pages, in Chinese).

* cited by examiner

*Primary Examiner* — Hoai V Pham
(74) *Attorney, Agent, or Firm* — NSIP Law (57) ABSTRACT

A semiconductor device includes a substrate with one or more active regions and an isolation layer formed to surround an active region and to extend deeper into the substrate than the one or more active regions. The semiconductor further includes a gate electrode, which covers a portion of the active region, and which has one end portion thereof extending over the isolation layer.

15 Claims, 8 Drawing Sheets

HIGH VOLTAGE SEMICONDUCTOR DEVICE

CROSS-REFERENCE TO RELATED APPLICATIONS

This application is a divisional of U.S. patent application Ser. No. 12/835,514, filed on Jul. 13, 2010, which claims priority from Korean Patent Application No. 10-2009-110927, filed on Nov. 17, 2009, the contents of all of which are incorporated herein by reference in their entirety.

TECHNICAL FIELD

The present disclosure relates generally to fabrication of a semiconductor device; and, more particularly, to fabrication of a high-voltage semiconductor device.

BACKGROUND OF RELATED ART

Various integrated circuits including one or more high-voltage transistors along with low-voltage circuits are in wide usage in diverse electrical applications. The high voltage transistors such as, for example, an extended drain MOS (EDMOS) transistor, a laterally double diffused MOS (LDMOS) transistor and the like occupy significant space in such integrated circuits.

In order to keep pace with the higher integration density trend, the high-voltage semiconductor devices also need to be scaled down in size while still maintaining sufficient operation characteristics.

Figure 1A:
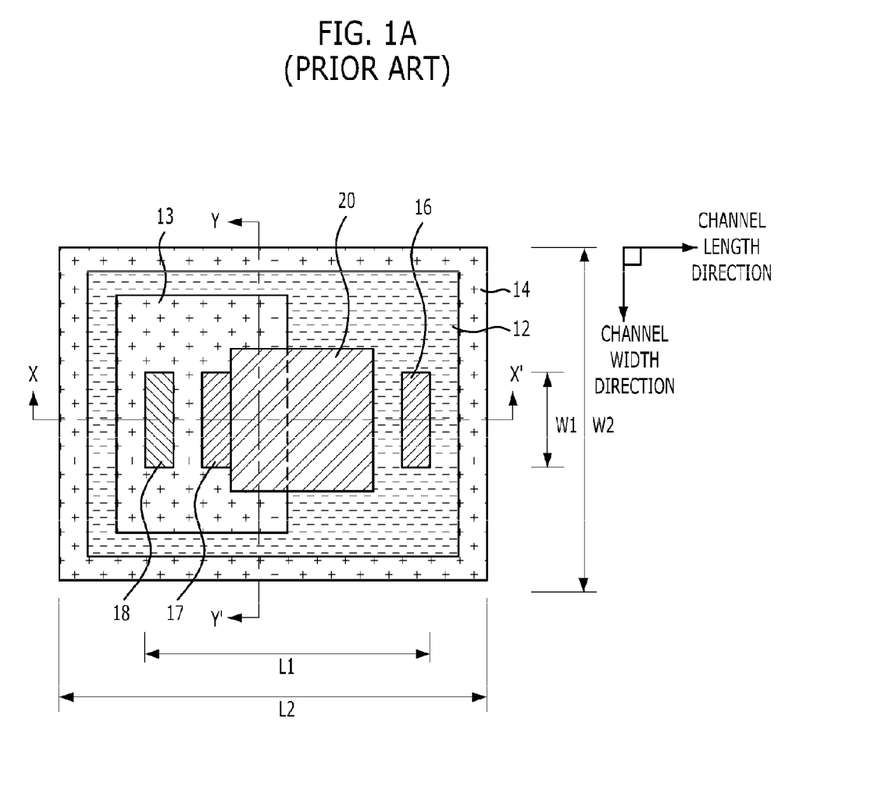
FIGS. 1A to 1C illustrate a conventional extended drain MOS (EDMOS) transistor.
Figure 1B:
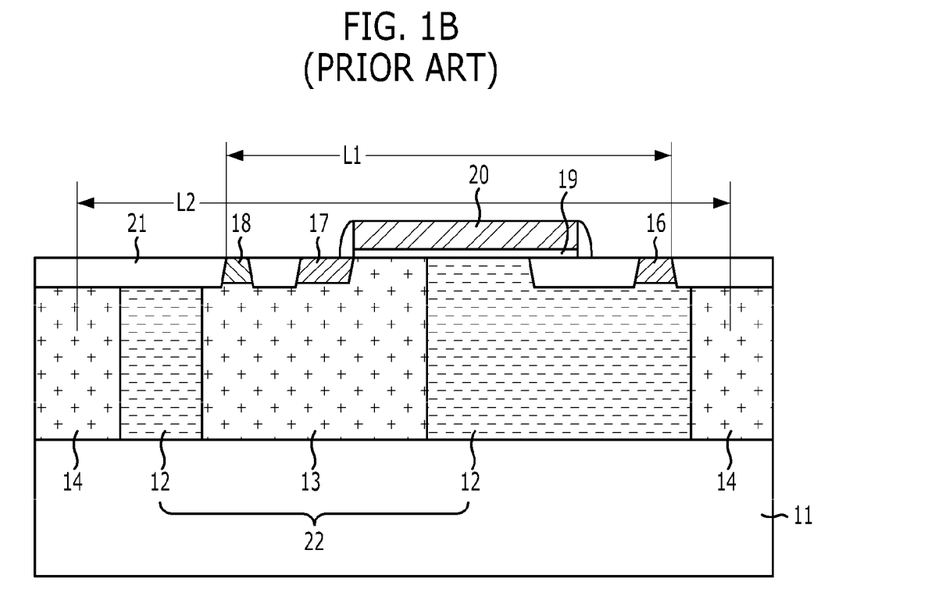

Illustrated in FIG. 1A in plan view is a conventional extended drain MOS (EDMOS) transistor. FIG. 1B is a cross-sectional view along the line X-X' of FIG. 1A, whereas FIG. 1C is another cross-sectional view along a line Y-Y' of FIG. 1A.

Figure 1C:
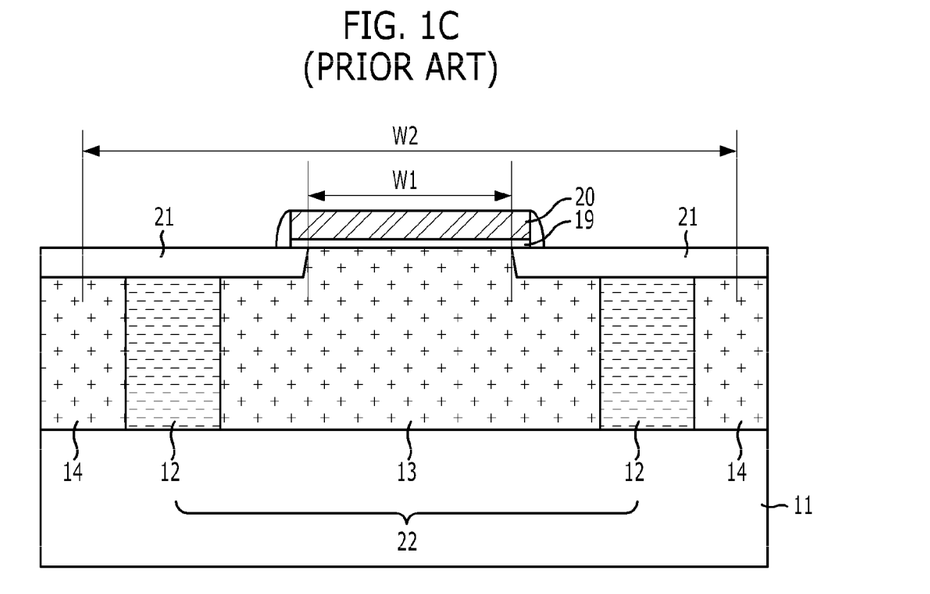

Referring to FIGS. 1A to 1C, the conventional EDMOS transistor includes active regions 22, a P-type impurity region 14, a gate electrode 20, a gate insulation layer 19, an N-type drain region 16, an N-type source region 17, and a P-type pick-up region 18. An active region 22 includes an N-type second well 12 formed over a substrate 11 and a P-type first well 13 formed in the N-type second well 12. The P-type impurity region 14 junction-isolates adjacent active regions 22. The gate electrode 20 crosses the P-type first well 13 and the N-type second well 12. The gate insulation layer 19 is interposed between the gate electrode 20 and the substrate 11. The N-type source region 17 is formed in the P-type first well 13 adjacent one end of the gate electrode 20. The N-type drain region 16 is formed in the N-type second well 12, and is spaced apart from the gate electrode 20. The P-type pick-up region 18 is formed in the P-type first well 13, and is spaced apart from the N-type source region 17.

As adjacent active regions 22 are junction-isolated from one another by the P-type impurity region 14 of the conductive type different from the N-type second well 12, such a conventional EDMOS transistor has the drawback of requiring a non-operation region in addition to the P-type impurity region 14 in order to ensure the isolation between the active regions 22 that may have different electrical potential from one another, and to also allow a sufficiently high operating voltage of the active regions 22.

That is, although the non-operation region is not involved in the actual operation of the EDMOS transistor, such non-operation region is nevertheless needed to allow the adjacent active regions 22 to operate at sufficient voltage and in isolation form one another. The non-operation region dictates the EDMOS transistor pitch, which may be defined as an area obtained by subtracting the operation region from the entire device region, where the operation region is the area defined by the multiplication of the operation length L1 by the operation width W1, and is the region in which actual carrier transfer occurs in the EDMOS transistor between operation, and where the entire device region is the area defined as the multiplication of the device length L2 by the device width W2.

The need for the inclusion of the non-operation region makes it difficult to increase the integration density of the EDMOS transistor. This may not be a problem associated with only the EDMOS transistor, but may be a common problem for all junction-isolated high-voltage semiconductor devices.

SUMMARY OF DISCLOSURE

One or more aspects of the present disclosure is directed to a high-voltage semiconductor device capable of high integration density and of sufficient operating voltage.

Various objects, features and advantages of the present disclosure will become apparent from the following description of several embodiments of the present disclosure.

According to an aspect of the present disclosure, there may be provided a semiconductor device that may include a substrate having formed therein an active region, an isolation layer formed in the substrate to surround sidewalls of the active region and a gate electrode configured over the substrate to cover a portion of the active region, the gate electrode having an end portion thereof extending over an upper portion of the isolation layer.

The isolation layer may extend deeper into the substrate than the active region.

The isolation layer may be formed through a deep trench isolation (DTI) process.

The active region may comprise a first conductive-type first well and a second conductive-type second well in contact with each other at respective well contacting sidewalls facing a channel lengthwise direction of the semiconductor device. Remaining sidewalls other than the well contacting sidewalls of the first conductive-type first well and the second conductive-type second well may be in contact with the isolation layer.

The gate electrode may extend over portions of both the first conductive-type first well and the second conductive-type second well along the channel lengthwise direction, and may have one end portion thereof extending over the upper portion of the isolation layer along a channel widthwise direction of the semiconductor device.

The semiconductor device may further comprise a second conductive-type source region formed in the first conductive-type first well adjacent a first side end of the gate electrode and a drain region formed in the second conductive-type second well. The drain region may be on an opposite side from the second conductive-type source region with respect to the gate electrode, and may be spaced apart from a second side end opposite the first side end of the gate electrode by a greater distance than a distance between the second conductive-type source region and the first side end of the gate electrode.

Each of sidewalls respectively of each of the second conductive-type source region and the drain region facing the channel widthwise direction of the semiconductor device may be in contact with the isolation layer.

The active region may alternatively comprise a second conductive-type deep well and a first conductive-type well formed inside the second conductive-type deep well. Each of sidewalls of the second conductive-type deep well may be in contact with the isolation layer. The sidewalls of the first conductive-type well facing the channel widthwise direction of the semiconductor device may be in contact with the isolation layer.

The gate electrode may have one end thereof along the channel lengthwise direction of the semiconductor device overlapped with a portion of the first conductive-type well, and may have another end along the channel widthwise direction of the semiconductor device that extends toward the upper portion of the isolation layer.

The semiconductor device may additionally comprise a second conductive-type source region formed in the first conductive-type first well adjacent to a first side end of the gate electrode and a second conductive-type drain region formed in the second conductive-type deep well adjacent a second side end opposite the first side end of the gate electrode.

Both sidewalls of each of the source region and the drain region facing the channel widthwise direction of the semiconductor device may be in contact with the isolation layer.

The gate electrode may be connected to the first conductive-type well so as to function as an anode. The second conductive-type deep well may function as a cathode.

According to another aspect of the present disclosure, semiconductor device formed on a substrate may be provided to include one or more active semiconductor regions, an isolation trench and a conductive electrode. The one or more active semiconductor regions may have respective depths by which the one or more active semiconductor regions extend along a direction into the substrate. The isolation trench may surround an associated one of the one or more active semiconductor regions so as to electrically isolate the associated one of the one or more active semiconductor regions from adjacent other ones of the one or more active semiconductor regions, and may extend along the direction into the substrate by a depth greater than the respective depths of the one or more active semiconductor regions. The conductive electrode may extend over a boundary interface between the associated one of the one or more active semiconductor regions and the isolation trench in such a manner covering portions respectively of both the associated one of the one or more active semiconductor regions and the isolation trench.

The associated one of the one or more active semiconductor regions may comprise a first well of a first conductivity type and a second well of a second conductivity type different from the first conductivity type. The second well may be arranged in relation to the first well in such a manner that the peripheral boundary of the second well has a portion thereof in contact with the first well and other portions thereof in contact with the isolation trench. The conductive electrode may extend in such a manner to cover portions respectively of both the first well and the second well.

According to an embodiment, the second well may have at least two opposing portions of the peripheral boundary thereof in contact with the first well.

The semiconductor device may comprise a transistor. The associated one of the one or more active semiconductor regions may comprise a source region formed in the first well, a drain region formed in the second well and a channel region, a length of which extends from the source region along a portion of the second well covered by the conductive electrode.

The semiconductor device may further comprise an insulating layer formed between the conductive electrode and the channel region.

The semiconductor device may further comprise a buried impurity layer of the first conductivity. The buried impurity layer may have first conductivity type impurity in higher concentration than concentration of first conductivity type impurities in the first well.

Each of the source region and the drain region may have a portion thereof that is in contact with the isolation trench.

The drain region may be spaced apart from the conductive electrode. The semiconductor device may further comprise a shallow isolation trench extending along a direction of the length of the channel region between a portion of the conductive electrode and the drain region. The shallow isolation trench may extend along the direction into the substrate by a shallow depth than the associated one of the one or more active semiconductor regions.

BRIEF DESCRIPTION OF THE DRAWINGS

Various features and advantages of the disclosure will become more apparent by the following detailed description of several embodiments thereof with reference to the attached drawings, of which.

DETAILED DESCRIPTION OF SEVERAL EMBODIMENTS

Several embodiments of the present disclosure will be described below in detail with reference to the accompanying drawings. It should be understood that these embodiments are not intended, and should not be construed, to limit the full scope of the present disclosure, and that aspects and features of the present disclosure may be carried out with different construct, configurations and elements than specifically detailed in those embodiments described herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present invention. The drawings are not necessarily to scale and in some instances, proportions may have been exaggerated for the sake of clarity. When a first layer is referred to as being "on" a second layer or "on" a substrate, it not only refers to a case where the first layer is formed in direct contact with the second layer or the substrate, but also to a case where a third layer exists between the first layer and the second layer or the substrate.

The following disclosure provides several embodiments of a high-voltage semiconductor device capable of high density of integration and of operating at a sufficient operation voltage. To that end, one or more aspects of the present disclosure provides the isolation of the regions having different electrical potentials from one another by the isolation layer formed through a deep trench isolation (DTI) process. According to one or more aspects of the present disclosure. a junction isolation technique may be used to isolate adjacent active regions from one another to thereby remove or minimize the required non-operation region. Such aspects of the present disclosure thus make it possible to realize an improvement in the integration density while still a sufficient operational voltage suitable for a high-voltage semiconductor device.

For the sake of illustrative convenience, an extended drain MOS (EDMOS) transistor having an N channel is described by way of an example. In the example, the first conductive type is the P type whereas the second conductive type refers to the N type. Of course, the following description is applicable substantially equally to an EDMOS transistor having a P channel, in which case, however, the first conductive type corresponds to N type while the second conductive type corresponds to P type.

Figure 2A:
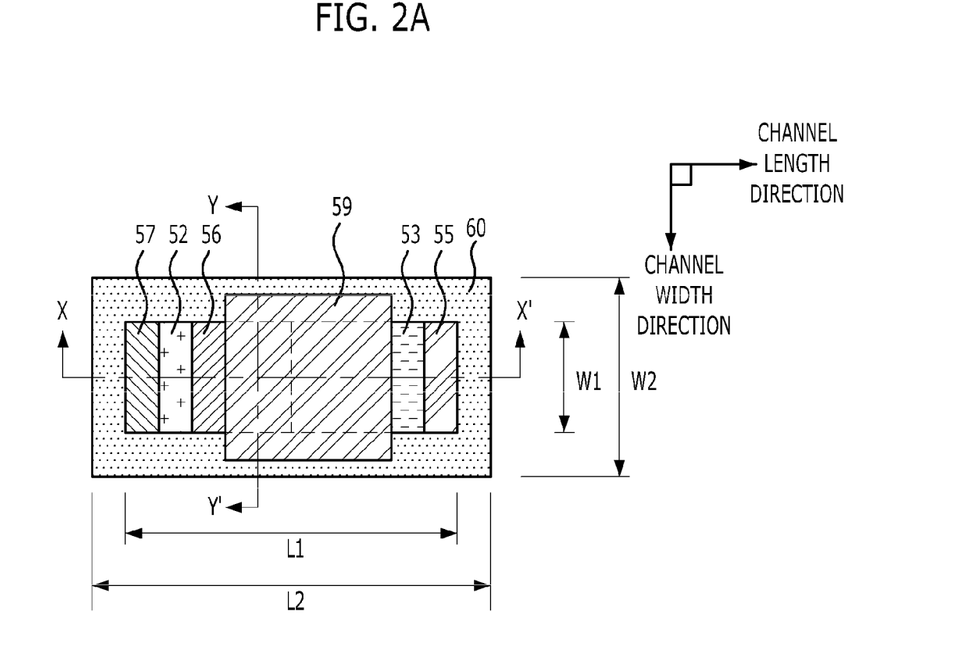
FIGS. 2A to 2C illustrate a semiconductor device in accordance with an embodiment of the present disclosure.
Figure 2B:
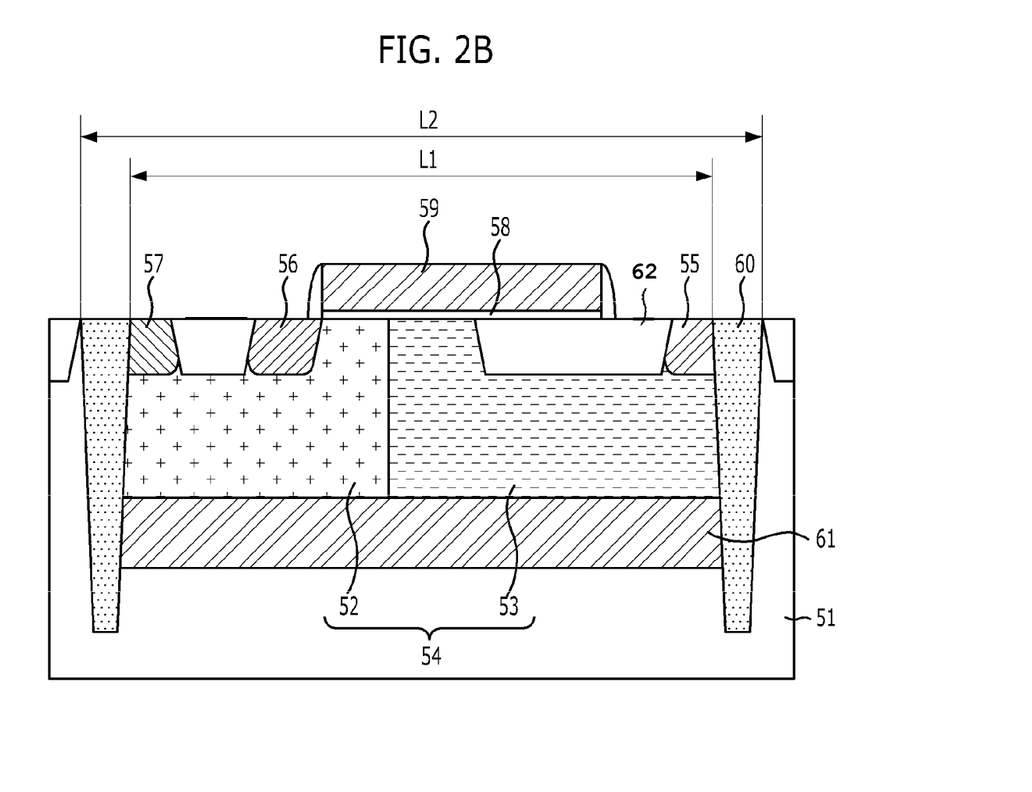
Figure 2C:
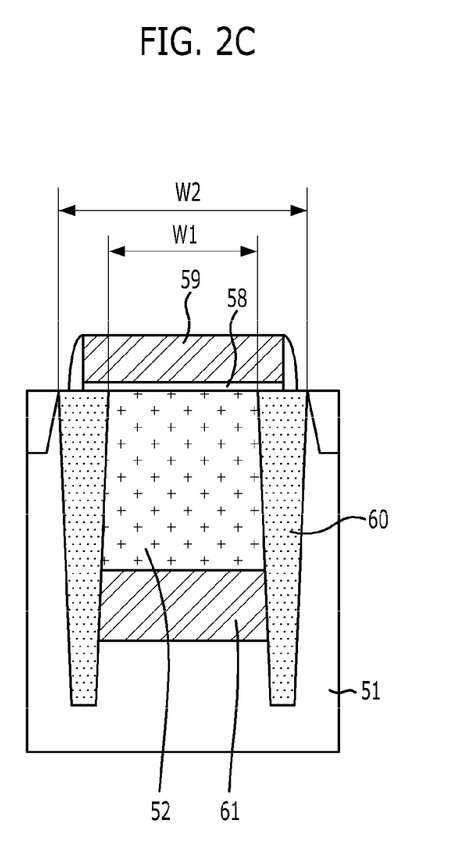

FIGS. 2A to 2C illustrate a semiconductor device in accordance with an embodiment of the present disclosure. FIG. 2A is a plan view of the semiconductor device. FIG. 2B is a cross-sectional view of the semiconductor device cut along a line X-X', whereas FIG. 2C is a cross-sectional view of the semiconductor device cut along a line Y-Y'.

Referring to FIGS. 2A to 2C, the semiconductor device according to an embodiment of the present disclosure may include active regions 54 each including a first conductive-type first well 52 and a second conductive-type second well 53 formed over a substrate 51 including a device isolation layer 62, an isolation layer 60 formed over the substrate 51 to surround each active region 54 for isolating adjacent active regions 54 from one another, a gate electrode 59 formed to extend to cover a portion of the active regions 54 and to have one or more ends thereof extending over the upper portion of the isolation layer 60, a gate insulation layer 58 interposed between the gate electrode 59 and the substrate 51, a second conductive-type source region 56 formed in the first conductive-type first well 52 adjacent one end portion of the gate electrode 59, a second conductive-type drain region 55 formed in the second conductive-type second well 53 to be spaced apart from the gate electrode 59, and a first conductive-type pickup region 57 formed in the first conductive-type first well 52 to be spaced apart from the second conductive-type source region 56. According to an embodiment, the device isolation layer 62 may be formed through a shallow trench isolation (STI) process.

The semiconductor device according to an embodiment of the present disclosure may further include a second conductive-type buried impurity layer 61 formed below the active regions 54 to be surrounded by the isolation layer 60. According to an embodiment, the second conductive-type buried impurity layer 61 may have impurity doping concentration that is higher than the impurity doping concentration of the active regions 54, and may improve the breakdown voltage characteristic of the EDMOS transistor.

The isolation layer 60 may have a depth deeper than the depth of the active regions 54 from the upper surface of the substrate 51 in order to effectively isolate the adjacent active regions 54 from one another. The isolation layer 60 having the above structure may be formed through a deep trench isolation (DTI) process.

The active region 54 includes the conductive-type second well 53 and the first conductive-type first well 52 in contact with each other. The remaining sidewalls of the first conductive-type first well 52 and the conductive-type second well 53, other than the sidewall (or junction surface) where the first conductive-type first well 52 contacts the conductive-type second well 53, may be in contact with the isolation layer 60.

The second conductive-type source region 56 and the second conductive-type drain region 55 may have both sidewalls along the channel length direction in contact with the isolation layer 60. When any of the sidewalls of the second conductive-type source region 56 and the second conductive-type drain region 55 extending along the channel length direction, that is the X-X' direction in FIG. 2A, the operation width W1 decreases by the spaced distance. As a result, the operational characteristics may deteriorate, and at the same time a non-operation region is created, thus adversely affecting the integration density of the semiconductor device.

In order to prevent such deterioration of the operational characteristics and the creation of the non-operation region, according to an embodiment, the first conductive-type pickup region 57 and the second conductive-type drain region 55 may each have one sidewall thereof extending in the channel width direction in contact with the isolation layer 60.

The gate electrode 59 may have a structure of crossing both the first conductive-type first well 52 and the conductive-type second well 53 along the channel length direction, which is the X-X' direction shown in FIG. 2A, and of having one or more ends extended over the upper portion of the isolation layer 60 along the channel width direction, which is the Y-Y' direction. By allowing an end portion of the gate electrode 59 to extend over the upper portion of the isolation layer 60 in the channel width direction, an improvement in the integration density may be realized. Conventionally, the gate electrode 59 may be designed to have a wider width than the channel width in order to prevent the variation of the channel width due to a processing error. However, when those portions of the gate electrode 59 in excess of the channel width are positioned over the active regions 54, the effective device width W2 may be increased by as much as the excess portions of the gate electrode 59. As a result, the integration density of the semiconductor device may be reduced.

The semiconductor device of the above-described structure according to an embodiment of the present disclosure may include the isolation layer 60 surrounding the active regions 54 to effectively isolate the active regions 54 respectively having different electrical potentials from one another while maintaining a sufficient operational voltage.

In particular, when compared with a case where the adjacent active regions 54 are isolated based on the conventional junction isolation technique, the semiconductor device according to an embodiment of the present disclosure may have an improved integration density by providing isolation of the adjacent active regions 54 from one another without requiring the formation of non-operational region(s) while maintaining a sufficient operational voltage.

With one or more ends of the gate electrode 59 extending over the upper portion of the isolation layer 60 in the channel width and/or length directions, it may be possible to further improve the integration density of the semiconductor device.

As described above, by including the isolation layer 60 surrounding the active regions 54, and by thereby increasing the integration density of the semiconductor device, the specific on resistance (RSP) of the high-voltage semiconductor device can be decreased to thereby improve the operational characteristics. In particular, the semiconductor device according to an embodiment of the present disclosure can remarkably reduce the difference between the entire region, defined as a multiplication of a device length L2 by a device width W2, and the operational area, which is defined as a multiplication of an operation length L1 and an operation width W1, so as to substantially reduce by the unnecessary non-operation region, and so that the entire region becomes substantially the operational regions in which carriers are transferred between operations. Since it is possible to reduce the overall size of the entire region, the specific on resistance (RSP), which is defined as the multiplication of the sum of resistance components existing between the second conductive-type source region 56 and the second conductive-type drain region 55 by the entire region, can be reduced, thereby improving the operational characteristics of the semiconductor device.

Hereafter, for purposes of illustration of aspects of the present disclosure, an example of an LDMOS transistor having an N channel according to an embodiment will be described. In such an example, the first conductive type is the P type, whereas the second conductive type is the N type. Of course, an LDMOS transistor having a P channel may be alternatively implemented as another embodiment, to which substantially the same description is applicable, and in which case however the first conductive type is the N type while the second conductive type is the P type.

Figure 3A:
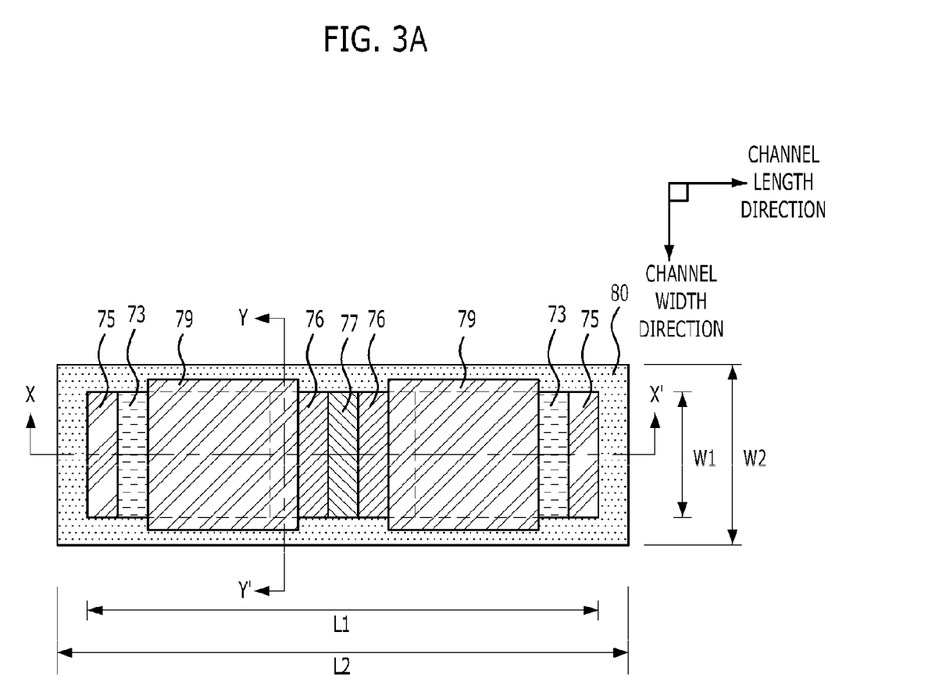
FIGS. 3A to 3C illustrate a semiconductor device in accordance with another embodiment of the present disclosure.
Figure 3B:
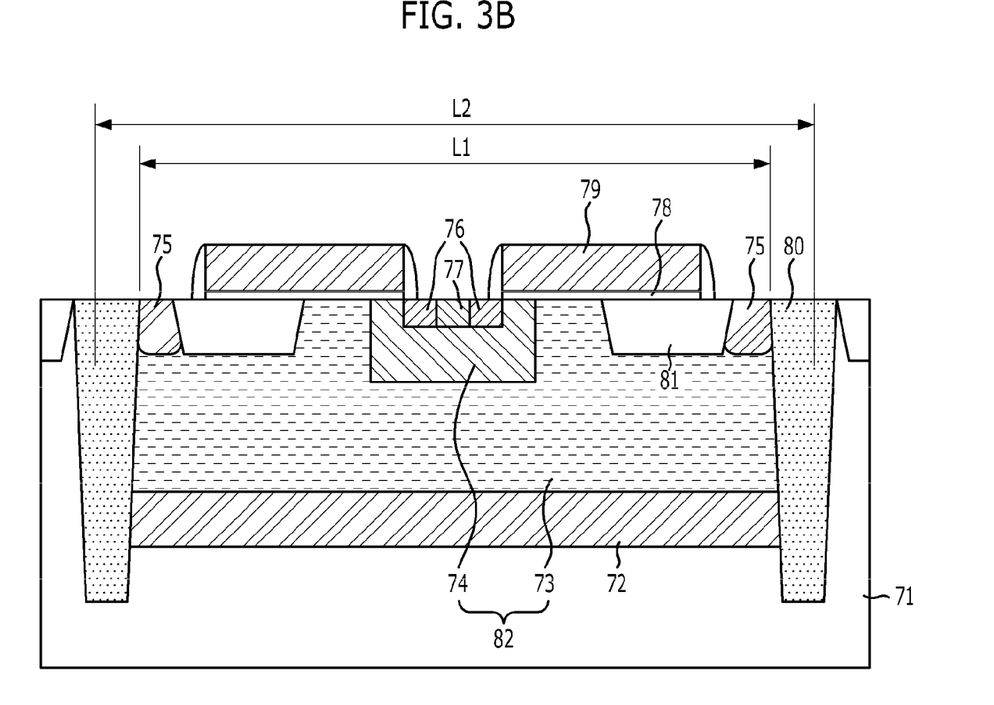
Figure 3C:
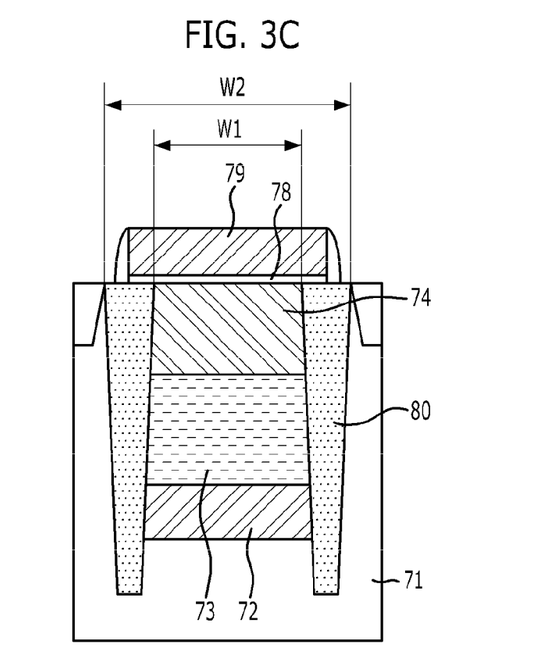

FIGS. 3A to 3C illustrate a semiconductor device in accordance with another embodiment of the present disclosure, where FIG. 3A is a plan view, FIG. 3B is a cross-sectional view along the line X-X', and FIG. 3C is a cross-sectional view along a line Y-Y', of the semiconductor device.

Referring to FIGS. 3A to 3C, the semiconductor device according to an embodiment of the present disclosure may include active regions 82 each including a second conductive-type deep well 73 formed over a substrate 71, which includes a device isolation layer 81 and a first conductive-type well 74 formed inside the second conductive-type deep well 73, an isolation layer 80 formed over the substrate 71 to surround each active region 82 and isolate adjacent active regions 82 from one another, a gate electrode 79 formed over the substrate 71 to cover a portion of the active regions 82 and having one end thereof extended toward the upper portion of the isolation layer 80, a gate insulation layer 78 interposed between the gate electrode 79 and the substrate 71, a second conductive-type source region 76 formed in the first conductive-type well 74 to be arrayed at one end of one side of the gate electrode 79, a second conductive-type drain region 75 formed in the second conductive-type deep well 73 to be spaced apart from one end of another side of the gate electrode 79 by a predetermined distance, and a first conductive-type pickup region 77 formed in the first conductive-type well 74. The device isolation layer 81 may be formed through a shallow trench isolation (STI) process.

The semiconductor device according to an embodiment of the present disclosure may further include a second conductive-type buried impurity layer 72 formed in the lower portion of the active regions 82 to be surrounded by the isolation layer 80. The second conductive-type buried impurity layer 72 may improve the breakdown voltage characteristics of the LDMOS transistor. The impurity doping concentration of the second conductive-type buried impurity layer 72 may be higher than the impurity doping concentration of the active regions 82, particularly, the second conductive-type deep well 73.

The isolation layer 80 may have a depth deeper than the depth of the active regions 82 extending from the upper surface of the substrate 71 in order to effectively isolate the adjacent active regions 82 from one another. The isolation layer 80 having the above structure may be formed through a deep trench isolation (DTI) process.

In the active regions 82 formed of the second conductive-type deep well 73 and the first conductive-type well 74 formed inside the second conductive-type deep well 73, all sidewalls of the second conductive-type deep well 73 contact the isolation layer 80 while the first conductive-type well 74 may have a structure where both of its sidewalls facing the channel width direction, which is Y-Y' direction, in contact with the isolation layer 80.

The second conductive-type source region 76 and the second conductive-type drain region 75 may have both sidewalls facing the channel width direction in contact with the isolation layer 80. When any of the sidewalls of the second conductive-type source region 76 and the second conductive-type drain region 75 that faces the channel width direction, which is Y-Y' direction, does not contact, but rather is spaced apart from, the isolation layer 80, the operational width W1 is decreased by such spaced distance. As a result, the operational characteristics may be deteriorated, and, at the same time, non-operation region(s) may be formed, thereby lowering the integration density of the semiconductor device that can be realized. In order to prevent the deterioration of the operational characteristics and the formation of the non-operation region(s), the second conductive-type drain region 75 may have one sidewall thereof facing the channel length direction, which is X-X' direction, in contact with the isolation layer 80.

The gate electrode 79 may have a structure of crossing both the first conductive-type well 74 and the second conductive-type deep well 73 along the channel length direction, which is the X-X' direction, to have one end thereof overlapping a portion of the first conductive-type well 74, and may have one end thereof extending toward the upper portion of the isolation layer 80 in the channel width direction, which is Y-Y' direction. As one end of the gate electrode 79 extends toward the upper portion of the isolation layer 80 in the channel width direction, the integration density of the semiconductor device may be improved. Conventionally, the gate electrode is designed to have a wider width than the channel width in order to prevent the variation of the channel width when fabricated due to processing error. When the portions of such conventional gate electrodes exceeding beyond the channel width are positioned over the active regions 82, the device width W2 is increased as much as the added width of the gate electrode. As a result, the integration density of the semiconductor device may be adversely affected.

The semiconductor device of the above-described structure according to an embodiment of the present disclosure may include the isolation layer 80 surrounding the active regions 82 to isolate the active regions 84 having different electrical potentials from one another while maintaining a sufficient operation voltage.

In particular, when compared with the case where the adjacent active regions 82 are isolated based on the conventional junction isolation technique, the semiconductor device according to the above-described embodiment of the present disclosure may improve the integration density by isolating the adjacent active regions 82 from one another with a substantially reduced non-operational region while maintaining a sufficient operation voltage.

By providing the above described structure that includes an end portion of the gate electrode 79 extending toward the upper portion of the isolation layer 80 along the channel width direction, it may be possible to realize further improvements in the integration density of the semiconductor device.

As described above, by the inclusion of the isolation layer 80 that surrounds the active regions 82, and by thereby increasing the integration density of the semiconductor device, the specific on resistance (RSP) of the high-voltage semiconductor device can be reduced, resulting in an improvement of the operational characteristics of the semiconductor device.

While in those embodiments thus far described, high-voltage MOS transistors, such as an EDMOS transistor, an LDMOS transistor and the like were described as illustrative examples, the features and aspects of the present disclosure may be applicable to other high-voltage semiconductor devices to which isolation layer(s) formed through the DTI process as herein described may be provided to isolate the active regions or wells. For example, a high-voltage electrostatic discharge (ESD) device according to another embodiment of the present disclosure will now be described as a further illustrative example. In the following example, the first conductive type is the P type whereas the second conductive type is the N type. Of course, depending on the particular application, the conductivity types may be reversed, that is, in alternative embodiments, the first conductive type may be the N type while the second conductive type may be the P type.

Figure 4A:
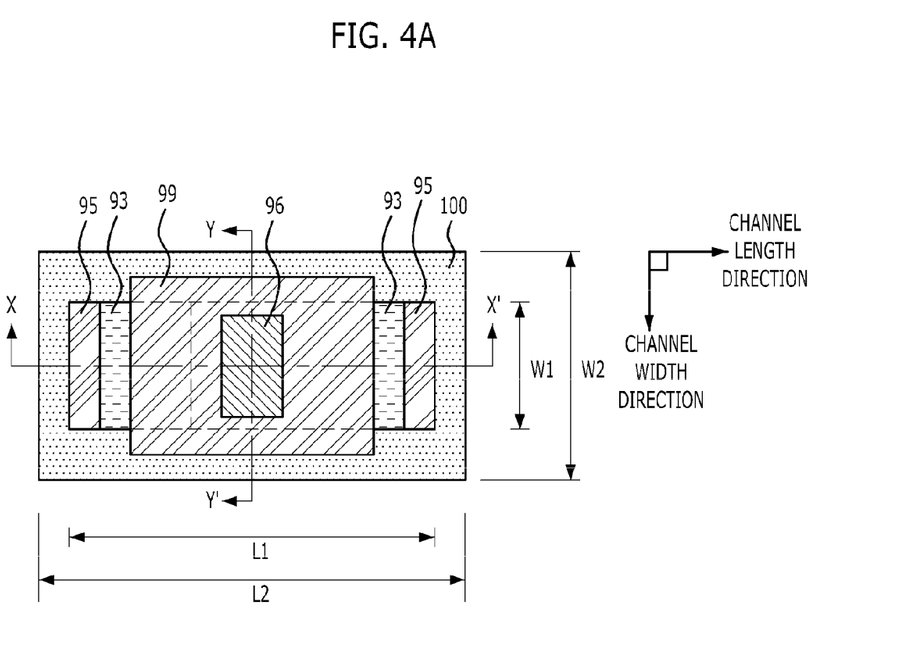
FIGS. 4A to 4C illustrate a semiconductor device in accordance with another embodiment of the present disclosure.
Figure 4B:
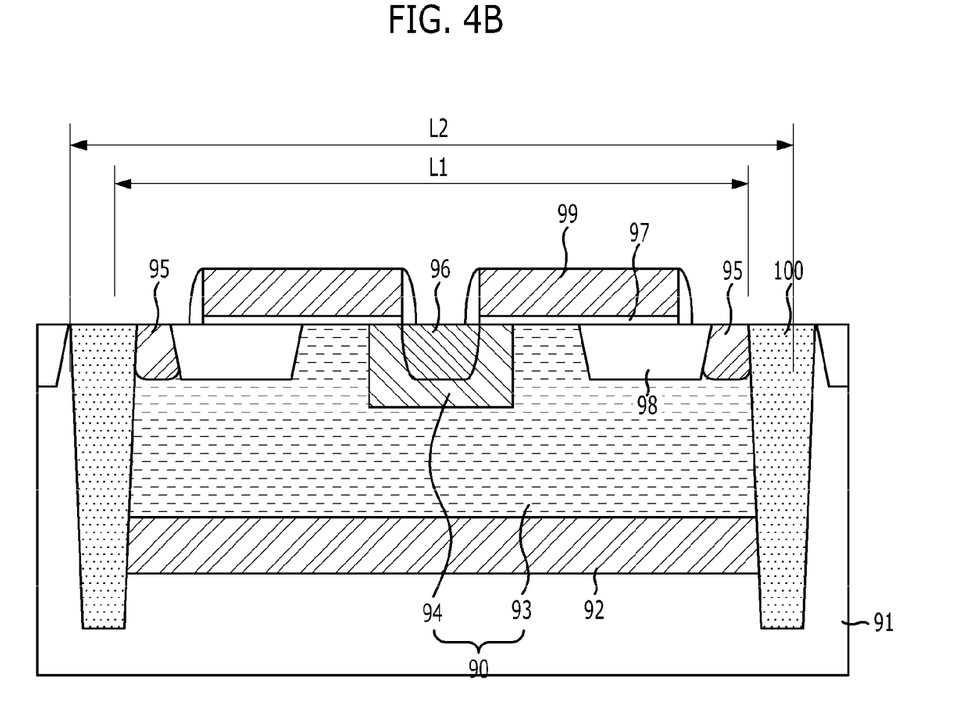
Figure 4C:
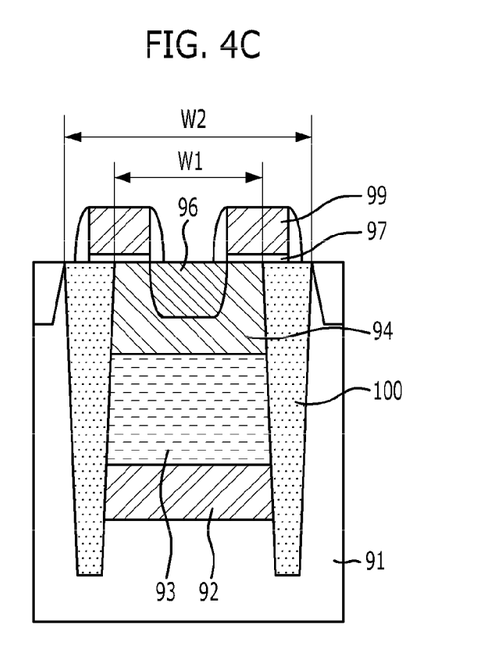

FIGS. 4A to 4C illustrate a semiconductor device in accordance with another embodiment of the present disclosure, of which figures, FIG. 4A is a plan view, FIG. 4B is a cross-sectional view along the line X-X', and FIG. 4C is a cross-sectional view along a line Y-Y', of the semiconductor device.

Referring to FIGS. 4A to 4C, the semiconductor device according to an embodiment of the present disclosure may includes a substrate 91 with a device isolation layer 98 formed through an STI process, active regions 90 each including a second conductive-type deep well 93 formed over the substrate 91 and a first conductive-type well 94 formed inside the second conductive-type deep well 93, an isolation layer 100 formed over the substrate 91 to surround each active region 90 and to isolate adjacent active regions 90 from one another, a gate electrode 99 that is formed over the substrate 91 to cover a portion of the active regions 90, and which has one end portion thereof extending toward the upper portion of the isolation layer 100, a gate insulation layer 97 interposed between the gate electrode 99 and the substrate 91, a first conductive-type first junction region 96 formed in the first conductive-type well 94 to be arrayed at one end of the gate electrode 99 and a second conductive-type second junction region 95 formed in the second conductive-type deep well 93 to be spaced apart from the gate electrode 99 by a predetermined distance. The device isolation layer 98 may be formed, for example, through a shallow trench isolation (STI) process.

The semiconductor device according to an embodiment may further include a second conductive-type buried impurity layer 92 formed in the lower portion of the active regions 90 to be surrounded by the isolation layer 100. The second conductive-type buried impurity layer 92 may improve the breakdown voltage characteristics of the ESD device. The impurity doping concentration of the second conductive-type buried impurity layer 92 may be higher than the impurity doping concentration of the active regions 90, particularly, of the second conductive-type deep well 93.

The isolation layer 100 may have a depth deeper than the depth of the active regions 90 extending from the upper surface of the substrate 91 in order to effectively isolate the adjacent active regions 82 from one another. The isolation layer 100 having the above structure may be formed through a deep trench isolation (DTI) process.

In the active regions 90 formed of the second conductive-type deep well 93 and the first conductive-type well 94 formed inside the second conductive-type deep well 93, the sidewalls of the second conductive-type deep well 93 facing the channel width direction, which is the Y-Y' direction in FIG. 4A, may contact the isolation layer 100 while the sidewalls of the first conductive-type well 94 facing the channel width direction may be in contact with the isolation layer 100.

The second conductive-type second junction region 95 and the first conductive-type first junction region 96 may have both sidewalls facing the channel width direction in contact with the isolation layer 100. When any of the channel width direction facing sidewalls of the first conductive-type first junction region 96 and of the second conductive-type second junction region 95 is spaced apart from the isolation layer 100, the operation width W1 is reduced by the spaced gap. As a result, the operational characteristics of the semiconductor device may deteriorate, and the integration density may become lower due to the formation of non-operation region(s). In order to prevent such deterioration of the operational characteristics and to reduce the formation of the non-operation regions, the second conductive-type second junction region 95 may further have one sidewall facing the channel length direction, i.e., the X-X' direction in FIG. 4A, also in contact with the isolation layer 100.

The gate electrode 99 may have a structure of crossing both the first conductive-type well 94 and the second conductive-type deep well 93 along the channel length direction, i.e., the X-X' direction, may have one end portion thereof overlapping with a portion of the first conductive-type well 94, and may have one end portion thereof extending toward the upper portion of the isolation layer 100 along the channel width direction, i.e., the Y-Y' direction. The gate electrode 99 having an end extending toward the upper portion of the isolation layer 100 along the channel width direction allows an improvement in the integration density of the semiconductor device. Conventionally, a gate electrode is designed to have a wider width than the channel width in order to account for the possible variation in the channel width during fabrication. When the regions of such conventional gate electrode formed to extend beyond the predetermined channel width is positioned over an active region, the device width W2 is increased by as much as the excess regions of the gate electrode, resulting in a lower integration density that can be realized with such a semiconductor device.

The semiconductor device according to an embodiment of the present disclosure having the above-described structure may include a PN junction diode where the gate electrode 99 and the first conductive-type well 94 are connected with each other to function as an anode while the second conductive-type deep well 93 functions as a cathode, and may thus be operable as an ESD device. The first conductive-type first junction region 96 improves the contact characteristics with respect to the first conductive-type well 94 while the second conductive-type second junction region 95 improves the contact characteristics with respect to the second conductive-type deep well 93.

With the isolation layer 100 surrounding the active regions 90, the semiconductor device according to an embodiment of the present disclosure can provide an effective isolation between the active regions 90 that may be operating at different respective electrical potentials while allowing a sufficient operational voltage, and also while reducing the formation or the necessity of non-operation regions, and may thereby allow an increase in the integration density in the resulting semiconductor device.

The gate electrode 99 according to an embodiment has the structure of having one end thereof extending toward the upper portion of the isolation layer 100 along the channel width direction, and thus may allow a further improvement in the integration density in the semiconductor device.

According to one or more aspects of the present disclosure, the above-described structures with an isolation layer surrounding the sidewalls of active regions can improve an operational voltage characteristics and the integration density of a high-voltage semiconductor device more effectively than a conventional device relying on a conventional junction isolation technique to isolate the adjacent active regions.

According to one or more aspects of the present disclosure, by allowing one end of a gate electrode to extend toward the upper portion of the isolation layer, further improvements in the operational voltage characteristics and/or the integration density of the high-voltage semiconductor device may be realized.

Further, according to one or more aspects of the present disclosure, the features and structures described herein allow a reduction in the specific on resistance of a semiconductor device by reducing the overall device area of the semiconductor device, and may thereby allow improvements in the operational characteristic of the semiconductor device.

While the disclosure has been particularly shown and described with reference to several embodiments thereof with particular details, it will be apparent to one of ordinary skill in the art that various changes may be made to these embodiments without departing from the principles and spirit of the disclosure, the scope of which is defined in the following claims and their equivalents.

What is claimed is:

1. A semiconductor device, comprising:
    a substrate having formed therein an active region comprising a first conductive-type first well and a second conductive-type second well disposed in a channel lengthwise direction of the semiconductor device;
    an isolation layer formed in the substrate to surround sidewalls of the active region; and
    a gate electrode configured over the substrate to cover a portion of the active region, the gate electrode having an end portion thereof extending over an upper portion of the isolation layer,
    wherein the gate electrode covers a portion of the active region in which the first well and the second well contact each other.

2. The semiconductor device of claim 1, wherein the isolation layer extends deeper into the substrate than the active region.

3. The semiconductor device of claim 1, wherein the isolation layer is formed through a deep trench isolation (DTI) process.

4. A semiconductor device, comprising:
    a substrate having formed therein an active region;
    an isolation layer formed in the substrate to surround sidewalls of the active region; and
    a gate electrode disposed over the substrate to cover a portion of the active region, the gate electrode having an end portion thereof extending over an upper portion of the isolation layer,
    wherein the active region comprises a first conductive-type first well and a second conductive-type second well in contact with each other at respective well contacting sidewalls facing a channel lengthwise direction of the semiconductor device, remaining sidewalls other than the well contacting sidewalls of the first conductive-type first well and the second conductive-type second well being in contact with the isolation layer.

5. The semiconductor device of claim 4, wherein the gate electrode extends over portions of both the first conductive-type first well and the second conductive-type second well along the channel lengthwise direction, and has one end portion thereof extending over the upper portion of the isolation layer along a channel widthwise direction of the semiconductor device.

6. The semiconductor device of claim 4, further comprising:
    a second conductive-type source region formed in the first conductive-type first well adjacent a first side end of the gate electrode; and
    a drain region formed in the second conductive-type second well, the drain region being on an opposite side from the second conductive-type source region with respect to the gate electrode and being spaced apart from a second side end opposite the first side end of the gate electrode by a greater distance than a distance between the second conductive-type source region and the first side end of the gate electrode.

7. The semiconductor device of claim 6, wherein sidewalls respectively of each of the second conductive-type source region and the drain region facing a channel widthwise direction of the semiconductor device are in contact with the isolation layer.

8. A semiconductor device formed on a substrate, comprising:
    one or more active semiconductor regions having respective depths by which the one or more active semiconductor regions extend along a direction into the substrate;
    an isolation trench surrounding an associated one of the one or more active semiconductor regions so as to electrically isolate the associated one of the one or more active semiconductor regions from adjacent other ones of the one or more active semiconductor regions, the isolation trench extending along the direction into the substrate by a depth greater than the respective depths of the one or more active semiconductor regions; and
    a conductive electrode extending over a boundary interface between the associated one of the one or more active semiconductor regions and the isolation trench in such a manner covering portions respectively of both the associated one of the one or more active semiconductor regions and the isolation trench,
    wherein the associated one of the one or more active semiconductor regions comprises a first well of a first conductivity type and a second well of a second conductivity type different from the first conductivity type; and the conductive electrode extends in such a manner to cover portions respectively of both the first well and the second well.

9. The semiconductor device of claim 8,
    wherein a peripheral boundary of the second well has a portion thereof in contact with the first well and other portions thereof in contact with the isolation trench.

10. The semiconductor device of claim 9, wherein the semiconductor device comprises a transistor, the associated one of the one or more active semiconductor regions comprising a source region formed in the first well, a drain region formed in the second well and a channel region, a length of which extends from the source region along a portion of the second well covered by the conductive electrode.

11. The semiconductor device of claim 10, further comprising an insulating layer formed between the conductive electrode and the channel region.

12. The semiconductor device of claim 10, further comprising a buried impurity layer of the second conductivity type, the buried impurity layer having second conductivity type impurity in higher concentration than concentration of second conductivity type impurities in the second well.

13. The semiconductor device of claim 10, wherein each of the source region and the drain region has a portion thereof that is in contact with the isolation trench.

14. The semiconductor device of claim 10, wherein the drain region being spaced apart from the conductive electrode, and
    wherein the semiconductor device further comprises a shallow isolation trench extending along a direction of the length of the channel region between a portion of the conductive electrode and the drain region, the shallow isolation trench extending along the direction into the substrate by a depth shallower than the associated one of the one or more active semiconductor regions.

15. The semiconductor device of claim 8, wherein the second well has at least two opposing portions of a peripheral boundary thereof in contact with the first well.

* * * * *